US008647893B1

(12) United States Patent
Agarwal et al.

(10) Patent No.: US 8,647,893 B1
(45) Date of Patent: Feb. 11, 2014

(54) METHOD FOR POST DECOMPOSITION DENSITY BALANCING IN INTEGRATED CIRCUIT LAYOUTS, RELATED SYSTEM AND PROGRAM PRODUCT

(75) Inventors: Kanak B. Agarwal, Austin, TX (US); Shayak Banerjee, White Plains, NY (US); Lars W. Liebmann, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/596,126

(22) Filed: Aug. 28, 2012

(51) Int. Cl.
*H01L 21/66* (2006.01)

(52) U.S. Cl.
USPC ......... 438/16; 438/14; 257/E21.522; 716/100

(58) Field of Classification Search
USPC ....................... 438/11; 257/E21.522, E21.524
See application file for complete search history.

(56) References Cited

U.S. PATENT DOCUMENTS

| | | | |
|---|---|---|---|
| 6,989,229 B2 | 1/2006 | Lucas et al. | |
| 8,074,187 B2 | 12/2011 | Ylinen | |
| 8,239,789 B2 | 8/2012 | Brunner et al. | |
| 2005/0216878 A1 | 9/2005 | Word et al. | |
| 2007/0009146 A1 | 1/2007 | Hendricus Hoeks et al. | |
| 2007/0245284 A1 | 10/2007 | Sinha et al. | |
| 2011/0269300 A1 | 11/2011 | Zia et al. | |
| 2012/0040280 A1 | 2/2012 | Agarwal et al. | |

OTHER PUBLICATIONS

Liebmann et al., "Decomposition-aware standard cell design flows to enable double-patterning technology", Proc. of SPIE 2011.
Lu et al., "A new graph-theoretic, multi-objective layout decomposition framework for Double Patterning Lithography," Proc. of Asia South Pacific Design Automation Conference, 2010.
Jeong et al., "Timing yield-aware color reassignment and detailed placement perturbation for double patterning lithography," Proc. of ICCAD 2009.
Cork et al., "Comparison of triple-patterning decomposition algorithms using aperiodic tiling patterns," Proc. of SPIE 2008.
Kahng et al., "Revisiting the Layout Decomposition Problem for Double Patterning Lithography," Proc. of SPIE, 2008.
Dusa et. al. "Pitch doubling through dual-patterning lithography challenges in integration and litho budgets," Proc. of SPIE, 2007.
U.S. Appl. No. 13/596,140, Office Action dated May 16, 2013.
U.S. Appl. No. 13/596,140, Notice of Allowance and Fees Due dated Aug. 28, 2013.

*Primary Examiner* — Cheung Lee
(74) *Attorney, Agent, or Firm* — Yuanmin Cai; Hoffman Warnick LLC

(57) ABSTRACT

Embodiments of the invention provide a method of modifying a decomposed integrated circuit (IC) layout. The method includes providing a decomposed IC layout, the decomposed IC layout including a set of colors; determining a density of each color in the decomposed IC layout, wherein each color includes a plurality of features formed by a related exposure; separating the decomposed IC layout into a set of tiles; determining a first color with a minimum density in one tile of the set of tiles and a second color with a maximum density in tile, the first color including a first set of first features and the second color including a first set of second features; and replacing the first set of second features on the tile with a second set of first features, and the first set of first features on the tile with a second set of second features.

20 Claims, 10 Drawing Sheets

METHOD FOR POST DECOMPOSITION DENSITY BALANCING IN INTEGRATED CIRCUIT LAYOUTS, RELATED SYSTEM AND PROGRAM PRODUCT

FIELD OF INVENTION

The subject matter disclosed herein relates to integrated circuits. More particularly, the subject matter relates to integrated circuit design, layout, and fabrication.

BACKGROUND

As integrated circuit (IC) devices (also referred to as semiconductor devices) advance technologically, many designers and applications are calling for physically smaller ICs. Advanced patterning techniques have been developed in order to meet the design constraints associated with these smaller devices without sacrificing IC performance. For example, multiple patterning techniques, such as double patterning and/or triple patterning of masks and/or IC layers may be used to meet design constraints in smaller devices (e.g., at the 14 nanometer (nm) node, and potentially beyond this node). This multiple patterning allows for devices and features to be formed (e.g., printed) at a closer proximity relative to one another over the course of multiple prints. In multiple patterning, one of the key steps is decomposition, where the features are separated into individual masks, such that when combined during lithography, they produce the desired features on the wafer without any defects. Typically, decomposition is performed in either a manual fashion, through the IC designer, or using an automated decomposition tool, which is capable of splitting a layout into separate masks for the multiple exposures.

However, with multiple patterning, the decomposition of a layout into e.g., two exposures by itself may not guarantee that the desired patterning and electrical behavior are produced in the completed IC. That is, it is also helpful to ensure that the density of shapes on both masks (in the double-patterning example) remains balanced and spaced appropriately, in order to ensure uniform etch behavior, and consequently uniform electrical performance. This balance may be difficult to achieve during the design process, or manual decomposition, due to IC size and design processes which include the work of several individual IC designers whom are responsible for smaller sub-areas of the IC which may inadvertently conflict. Further, it is also prohibitively time consuming to achieve density balancing using an automated decomposition tool, because of the need to solve a complex optimization problem on a large scale. Conventional approaches of designing layouts for multiple patterning processes are deficient in producing the desired result.

BRIEF DESCRIPTION

Various embodiments include solutions for modification of a decomposed integrated circuit (IC) layout for a multiple (e.g., double, triple, etc.) patterning process. In various embodiments, a method of designing an integrated circuit (IC) layout for a multiple patterning process includes: providing a decomposed IC layout, the decomposed IC layout including a set of colors; separating the decomposed IC layout into a set of tiles; determining a density of each color in at least one tile of the set of tiles, wherein each color includes a plurality of features formed by a related exposure; determining a first color with a minimum density in the at least one tile of the set of tiles and a second color with a maximum density in the at least one tile, the first color including a first set of first features and the second color including a first set of second features; and replacing the first set of second features on the at least one tile with a second set of first features, and the first set of first features on the at least one tile with a second set of second features.

A first aspect of the invention includes a method of modifying a decomposed integrated circuit (IC) layout for a multiple patterning process, the method including: providing a decomposed IC layout, the decomposed IC layout including a set of colors; determining a density of each color in the decomposed IC layout, wherein each color includes a plurality of features formed by a related exposure; separating the decomposed layout into a set of tiles; determining a first color with a minimum density in at least one tile of the set of tiles and a second color with a maximum density in the at least one tile, the first color including a first set of first features and the second color including a first set of second features; and replacing the first set of second features on the at least one tile with a second set of first features, and the first set of first features on the at least one tile with a second set of second features.

A second aspect of the invention includes a system including: at least one computing device configured to modify a decomposed integrated circuit (IC) layout for a multiple patterning process by performing actions including: providing a decomposed IC layout, the decomposed IC layout including a set of colors; determining a density of each color in the decomposed IC layout, wherein each color includes a plurality of features formed by a related exposure; separating the decomposed IC layout into a set of tiles; determining a first color with a minimum density in at least one tile of the set of tiles and a second color with a maximum density in the at least one tile, the first color including a first set of first features and the second color including a first set of second features; and replacing a single feature of the second color on the decomposed layout with a single feature of a first color.

A third aspect of the invention includes a computer program product including program code stored on a computer-readable storage medium, which when executed by at least one computing device, causes the at least one computing device to perform actions including: providing a decomposed IC layout, the decomposed IC layout including a set of colors; determining a density of each color in the decomposed IC layout, wherein each color includes a plurality of features formed by a related exposure; separating the decomposed IC layout into a set of tiles; determining a first color with a minimum density in at least one tile of the set of tiles and a second color with a maximum density in the at least one tile, the first color including a first set of first features and the second color including a first set of second features; and replacing the first set of second features on the at least one tile with a second set of first features, and the first set of first features on the at least one tile with a second set of second features.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
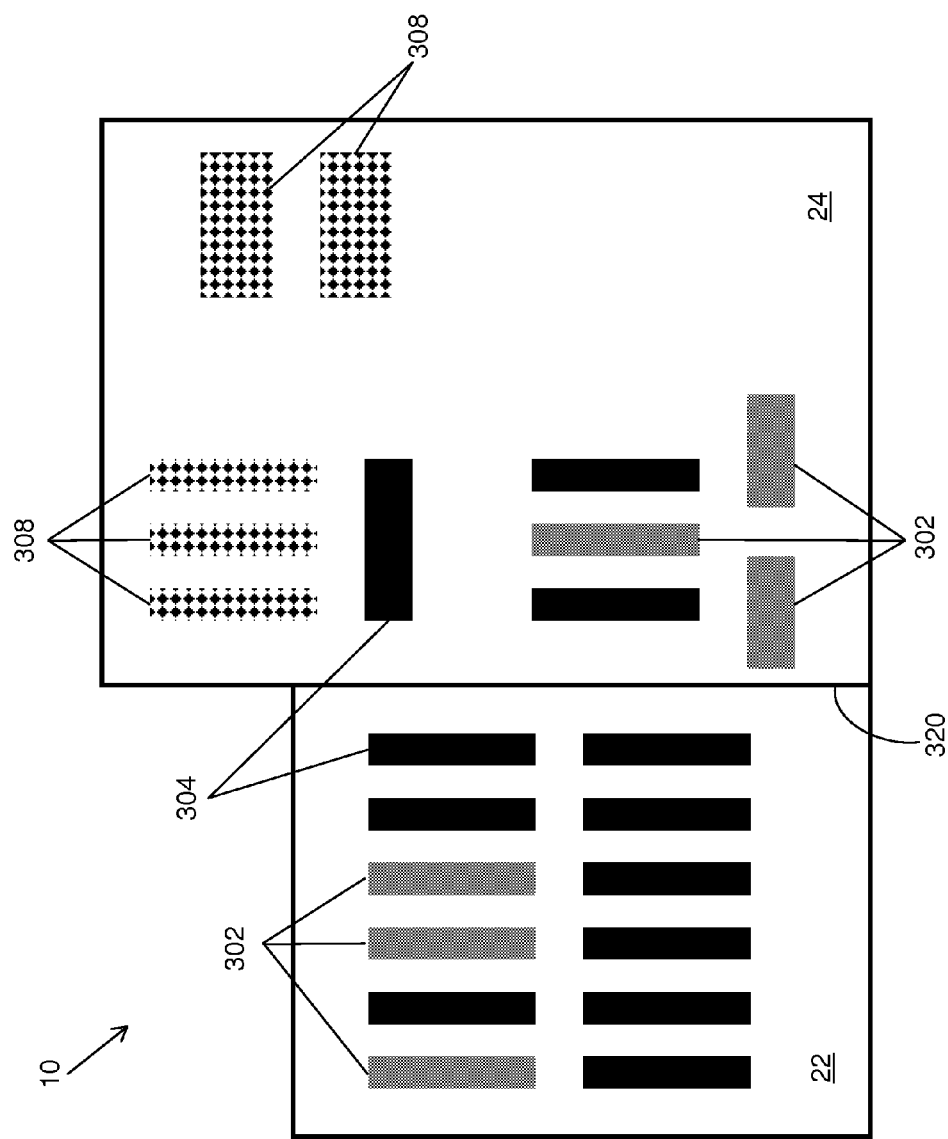
FIG. 1 is a demonstrative illustration of a portion of an integrated circuit according to various embodiments of the invention.

It is noted that the drawings of the disclosure are not necessarily to scale. The drawings are intended to depict only typical aspects of the disclosure, and therefore should not be considered as limiting the scope of the disclosure. It is understood that elements similarly numbered between the FIGURES may be substantially similar as described with reference to one another. Further, in embodiments shown and described with reference to FIGS. 1-15, like numbering may represent like elements. Redundant explanation of these elements has been omitted for clarity. Finally, it is understood that the components of FIGS. 1-15 and their accompanying descriptions may be applied to any embodiment described herein.

DETAILED DESCRIPTION OF THE INVENTION

As noted, the subject matter disclosed herein relates to integrated circuits. More particularly, the subject matter relates to integrated circuit fabrication and layout design. These solutions are based on using color flipping and color modifications to balance densities on a decomposed layout, where the term "color" refers to a type of exposure mask. As used herein, different colors can refer to different types of exposure mask, e.g., red correlating with a first exposure mask, green correlating with second exposure mask, blue correlating with a third exposure mask, etc.

As described herein, in the case of multiple patterning, decomposing a layout into multiple (e.g., two exposures, three exposures, four exposures, etc.) exposures may not guarantee that the desired patterning is accurately produced in the completed IC. That is, it is also helpful to ensure that the density of shapes on both masks (in the double-patterning example) remains balanced, in order to ensure uniform etch behavior. However, it can be difficult to enforce these shape density parameters during the design process because IC designers are responsible for large areas of the IC.

In contrast to the conventional approaches, various embodiments include modifying a decomposed IC layout through feature/node/color modification, replacement, and/or substitution to remap colors on the layout for better control and uniform density across the multiple exposures of an integrated circuit. Various embodiments include solutions for modifying a decomposed integrated circuit (IC) layout for a multiple (e.g., double, triple, etc.) patterning process to achieve balance of densities between the various exposures. These embodiments include local color modification methods, wherein for each conflict graph formed by features located within a certain minimum resolvable distance on the IC layout, individual nodes or features can be moved to the exposure with minimum density, provided certain constraints are met, to better balance the densities. As described herein, various embodiments of the invention include approaches for balancing the types of exposure masks used in layout windows of an integrated circuit layout.

Various embodiments of the invention include a method of designing an integrated circuit (IC) layout for a multiple patterning process. In some cases, the method includes: providing a decomposed layout; determining a density of each color in the decomposed layout, wherein each color includes a plurality of features formed by a related exposure; separating the decomposed layout into a set of tiles; determining a first color with a minimum density in at least one tile of the set of tiles and a second color with a maximum density in the at least one tile, the first color including a first set of first features and the second color including a first set of second features; and replacing the first set of second features on the at least one tile with a second set of first features, and the first set of first features on the at least one tile with a second set of second features.

Various additional embodiments of the invention include a system having at least one computing device configured to design an integrated circuit (IC) layout for a multiple patterning process by performing actions including: providing a decomposed layout; separating the decomposed layout into a set of tiles; determining a density of each color in at least one tile in the set of tiles, wherein each color includes a plurality of features formed by a related exposure; determining a first color with a minimum density in the at least one tile of the set of tiles and a second color with a maximum density in the at least one tile, the first color including a first set of first features and the second color including a first set of second features; and replacing a single feature of the second color on the decomposed layout with a single feature of a first color.

Various other embodiments of the invention includes a computer program product including program code stored on a computer-readable storage medium, which when executed by at least one computing device, causes the at least one computing device to perform actions including: providing a decomposed layout; determining a density of each color in the decomposed layout, wherein each color includes a plurality of features formed by a related exposure; separating the decomposed layout into a set of tiles; determining a first color with a minimum density in at least one tile of the set of tiles and a second color with a maximum density in the at least one tile, the first color including a first set of first features and the second color including a first set of second features; and replacing the first set of second features on the at least one tile with a second set of first features, and the first set of first features on the at least one tile with a second set of second features.

The various solutions disclosed utilize heuristic algorithms, density-aware color flipping and density aware local coloring modifications to balance the density of features and/or shapes on multiple exposures in addition to achieving density uniformity. These solutions are based on using color flipping and color modifications to balance densities on a decomposed layout, where the term "color" refers to a type of exposure mask. As used herein, different colors can refer to different types of exposure mask, e.g., red correlating with a first exposure mask, green correlating with second exposure mask, blue correlating with third exposure mask, etc. The approach further includes using a set of formulations to separate a given layout into a set of tiles, flip colors on the layout to balance the density, and/or locally modify colors within each tile of the set of tiles to decrease density imbalances. These methods and formulations thereby minimizing the density imbalance in each decomposed layout subject to meeting IC/design density constraints.

The various approaches of the invention include approaches for minimizing the density imbalance using conflict graphs and various algorithms (e.g., a layout splitting algorithm). The approaches described according to various embodiments have several advantages including: a) approaches according to embodiments are extendable/applicable to any number of masks/exposures; b) these approaches are combinable with methods of layout decomposition (whether automated or manual) used by the IC data processing components; c) these approaches require no more than small changes to the existing layout fill infrastructure; d) these approaches run in linear time; and e) these approaches reduce the burden of balancing densities on the IC designer.

Turning to FIG. 1, a demonstrative illustration of a decomposed layout 10 is shown including a first set of features 302 (e.g., trenches, etches, patterns, etc.), a second set of features 304 (e.g., trenches, etches, patterns, etc.), and a third set of features 308 (e.g., trenches, etches, patterns, etc.) according to embodiments. Each set of features 302, 304, and 308 may be formed by a different exposure (e.g., color) as indicated by the styling of each feature/component. In this embodiment, decomposed layout 10 may be separated into a first tile 22 (e.g., a portion of decomposed layout 10 which is isolated/disconnected from other portions of the decomposed layout) and a second tile 24 for density balancing processing. As decomposed layout 10 is split into tiles 22 and 24, the processing for each tile 22 and 24, and the overall decomposed layout 10 may be simplified. Tiles 22 and 24, and the features 302, 304, and 308 thereon, may be processed/analyzed in parallel and may be represented by conflict graphs 350 and 370 (See FIGS. 7 and 8) respectively. Separation/creation of tiles 22 and 24 may be based on a distance between features (e.g., features which are in conflict (e.g., less than a minimum distance criterion a from one another) may not be separated on different tiles). Separation of features which are located at a distance less than $\alpha$ relative one another may produce a conflict and effect the efficacy of the decomposed layout 10. Minimum distance criterion '$\alpha$' may be set by: a designer, a standard, selected by a computing device, etc. Tiles 22 and 24 may be disconnected (e.g., independent) relative one another such that no conflicts exist between features/nodes/elements on the two tiles. During processing, adjustments, substitutions, swapping, flipping, etc. of features on either tile 22 and/or 24 will not affect conflicts on decomposed layout 10.

Figure 2:
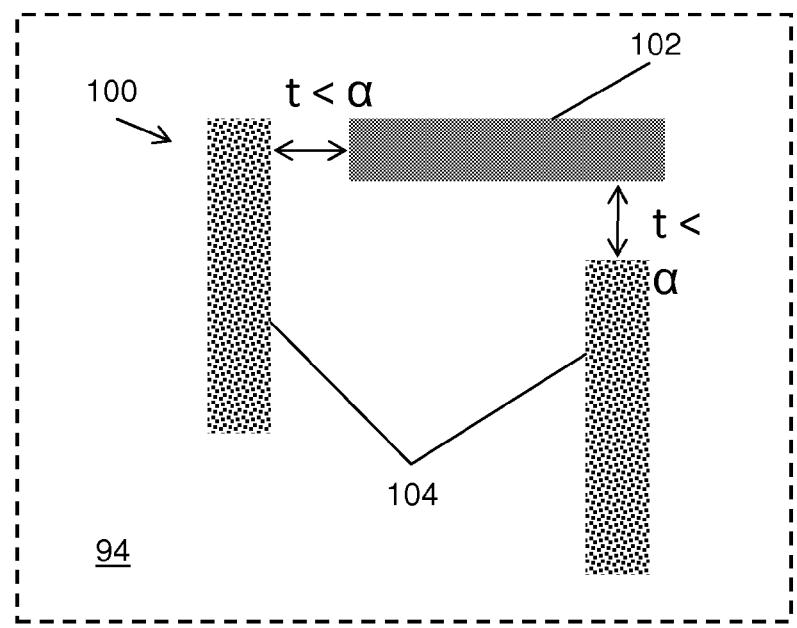
FIG. 2 is a demonstrative illustration of a portion of an integrated circuit according to various embodiments of the invention.
Figure 3:
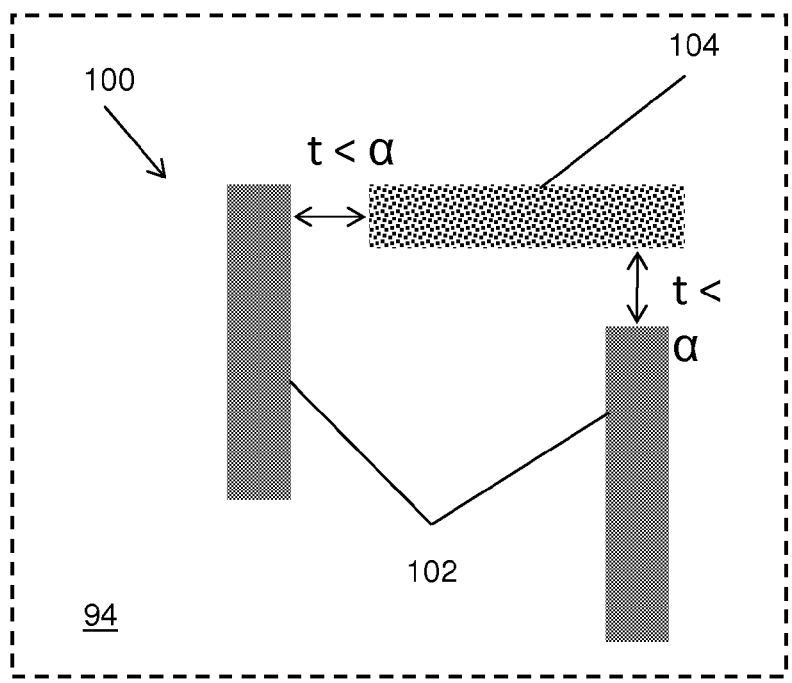
FIG. 3 is a demonstrative illustration of a portion of an integrated circuit according to various embodiments of the invention.

Turning to FIG. 2, a demonstrative illustration of a tile 100 of a decomposed layout 94 is shown including a set of first features 104 and a second feature 102 according to embodiments. As discussed herein, tiles may be determined by separating features/nodes (e.g., conflict graphs) which do not interact/are located at a distance greater than $\alpha$ relative one another. In this embodiment, each of set of first features 104 is located at a distance 't' relative second feature 102 which is less than a minimum distance criterion $\alpha$. As these features are located relative one another at a proximity which is less than $\alpha$, these features are in conflict and are inseparable during a tiling process, thereby forming tile 100. Tile 100 is disconnected from other tiles on decomposed layout 94 by virtue of the fact that set of first features 104 and second feature 102 are located at a distance greater than $\alpha$ from all other features on decomposed layout 94. As these three features (set of first features 104 and second feature 102) form tile 100, and are spatially isolated (e.g., located at a distance greater than $\alpha$ from other features in the decomposed layout), adjustments to the order of coloring in tile 100 may be made within these features which will not conflict/impact other features and/or tiles in the decomposed layout. As can be seen in FIG. 3, on tile 100, a set of second features 102 may be substituted for set of first features 104, and a first feature 104 may be substituted for second feature 102 without conflicting with other tiles/nodes on decomposed layout 94. This swap impacts exposure densities for tile 100 and decomposed layout 94, but avoids introduction of new conflicts in decomposed layout 94 as tile 100 is disconnected/isolated relative other tiles and features on decomposed layout 94. Substitution of colors may be performed based on a heuristic algorithm which enables linear-time flipping and parallelization amongst tiles on decomposed layout 94. In one embodiment, the heuristic algorithm may comprise a linear-time algorithm which depends on the number of features present. The runtime for the heuristic algorithm may increase linearly as the number of features in a given tile increases.

Figure 4:
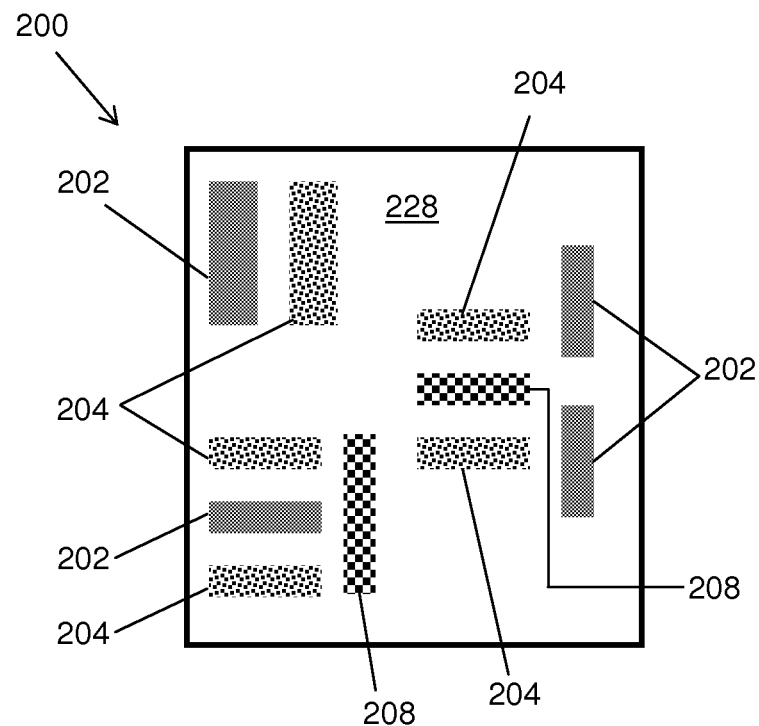
FIG. 4 is a demonstrative illustration of a portion of an integrated circuit according to various embodiments of the invention.
Figure 5:
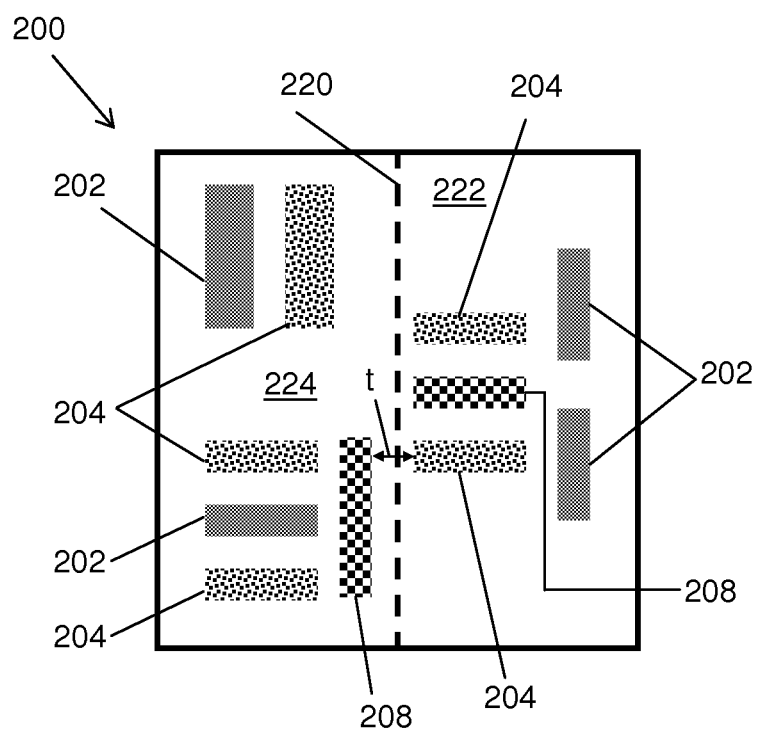
FIG. 5 is a demonstrative illustration of a portion of an integrated circuit according to various embodiments of the invention.

Turning to FIG. 4, a demonstrative illustration of a tile 228 is shown including a first set of features 202, a second set of features 204, and a third set of features 208. Tile 228 may be a portion of a decomposed layout. As can be seen in FIG. 5, tile 228 may not be divided into a first tile 222 and a second tile 224, as separation along line 220 (shown in phantom) would isolate a second feature 204 and a third feature 208 which are located at a distance t which is less than minimum distance $\alpha$.

Figure 6:
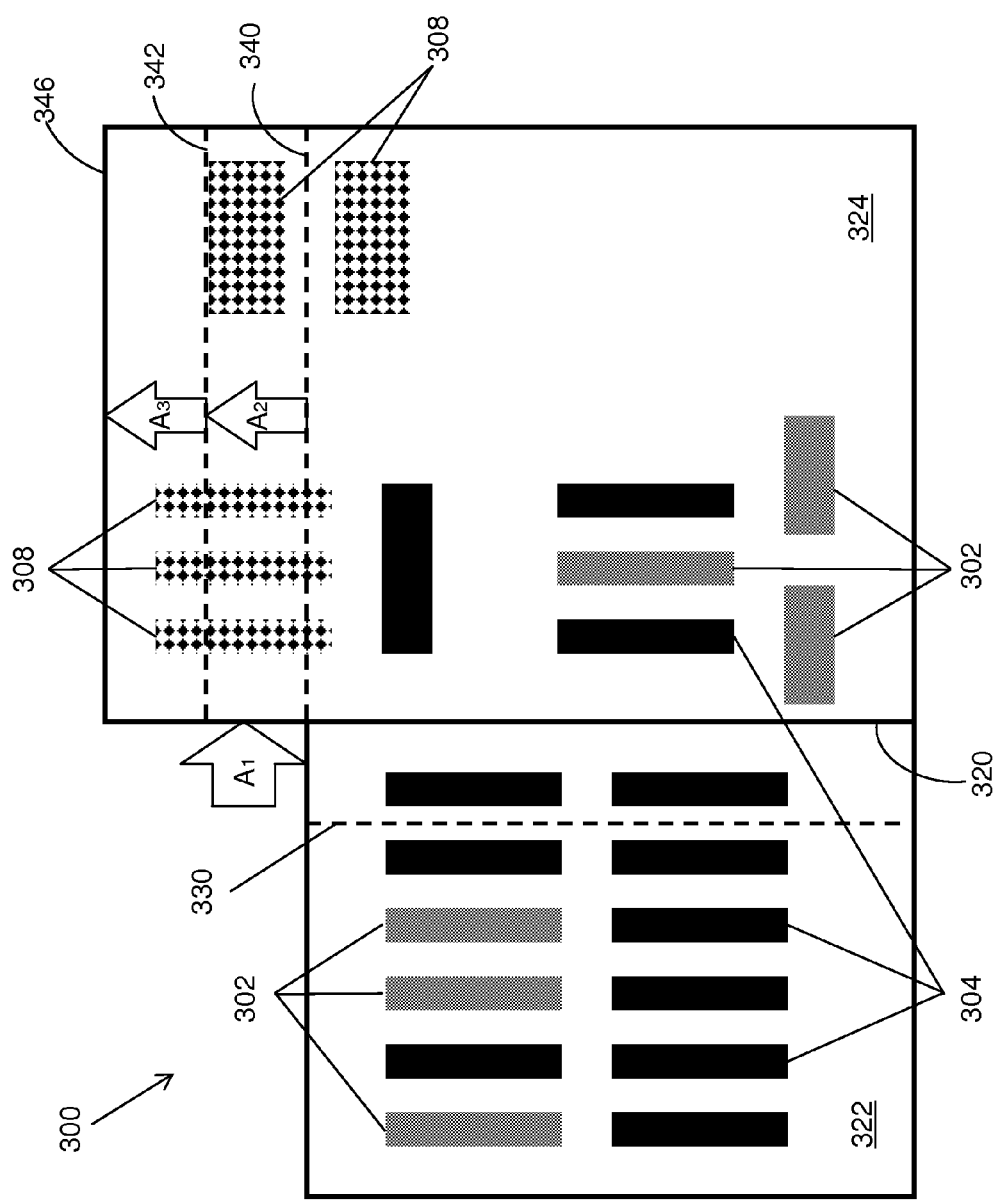
FIG. 6 is a demonstrative illustration of a portion of an integrated circuit according to various embodiments of the invention.

Turning to FIG. 6, a demonstrative illustration of a portion of a decomposed layout 300 is shown during a layout tiling process including a first tile 322 and a second tile 324 according to embodiments. First tile 322 may include a set of first features 302 and a set of second features 304, and may be separated from second tile 324 by tile border 320. Second tile 324 may include a set of first features 302, a set of second features 304, and a set of third features 308. Layout tiling may include an iterative process which intends to create a tile of minimum size. In one embodiment, the minimum tile size may be set in accordance with a standard value (e.g., by a designer, a standard, selected by a computing device, etc.) During layout tiling, a series of tile boundaries may be selected and tested for the decomposed layout, these tile boundaries being placed proximate the origin and other tile boundaries and analyzed to determine if there is a conflict across the tile boundaries. When it is determined that a conflict exists across a tile boundary, the tile boundary is expanded and then reanalyzed to detect conflicts. Once it is determined that all tile boundaries are conflict free, then the tile is accepted and the tile selection process is begun from the new tile boundaries. In one embodiment, expansion of the tile boundary may be in multiples of a minimum pitch (e.g., the sum of width and space between adjacent features) of metal in the decomposed layout. The minimum being set/determined by limitations of lithographic process capabilities.

As can be seen, during tiling/separation of decomposed layout 300, a first tile border 330 (shown in phantom) was not acceptable. The location of first tile border 330 would have separated features which were in conflict (e.g., located proximate one another at a distance less than $\alpha$). Once this conflict/distance was determined, first tile border 330 was removed and replaced with second tile border 320 (shown in phantom) which was located a distance A1 away from the position of first tile border 330. As second tile border 320 only separated features which were not in conflict (e.g., located at a distance greater than $\alpha$ relative one another), second tile border 320 was approved and first tile 322 and second tile 324 were designated. Similarly, during separation, attempts to further tile/separate second tile 324 included a third tile border 340, a fourth tile border 342, and a fifth tile border 346 (shown in phantom). During selection third tile border 340 was tested and found to segment features 308 and as such was not approved/appropriate. Following the dismissal of third tile border 340, fourth tile border 342 was located at a distance A2 from third tile border 340 and tested. Fourth tile border 342 segmented features 308 and was rejected. Fifth tile border 346 was located a distance A3 from fourth tile border 342 and does not segment features or separate features which are less than $\alpha$ apart.

Figure 7:
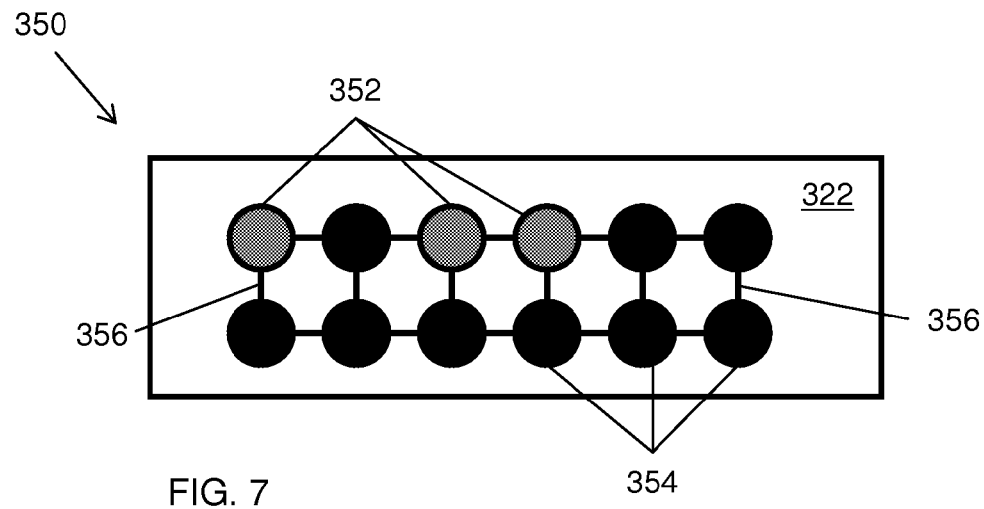
FIG. 7 is a demonstrative illustration of a portion of an integrated circuit according to various embodiments of the invention.

Turning to FIG. 7, a demonstrative illustration of a portion of a conflict graph 350 is shown representing first tile 322 according to embodiments. Conflict graph 350 includes a plurality of first feature nodes 352 and a plurality of second feature nodes 354 which correspond respectively to features 302 and 304 on tile 322. Nodes which are located relative one another at a distance that is less than $\alpha$ in decomposed layout 300 and/or tile 322, are connected by a line/edge 356 in conflict graph 350. As can be seen in a comparison between tile 322 in FIG. 6 and conflict graph 350 in FIG. 7, features spaced at a distance closer than $\alpha$ become nodes of conflict graph 350 connected by lines/edges 356.

Figure 8:
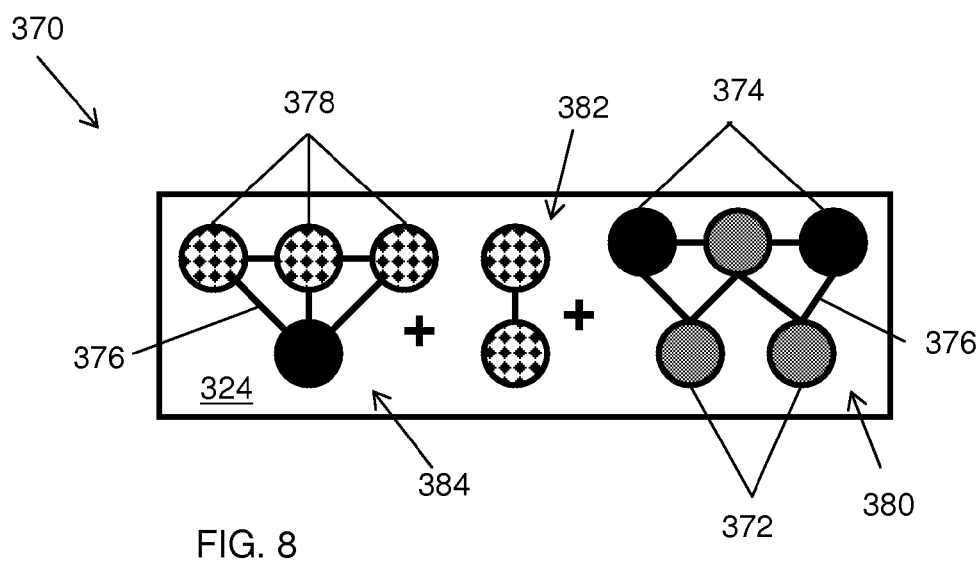
FIG. 8 is a demonstrative illustration of a portion of an integrated circuit according to various embodiments of the invention.

Turning to FIG. 8, a demonstrative illustration of a portion of a set of conflict graphs 380, 382, and 384 are shown representing second tile 324 according to embodiments. Conflict graphs 380, 382, and 384 are generated such that no two adjacent nodes in the graph may be on the same exposure (i.e. be of the same 'color') during the decomposition process, as this orientation would lead to faulty or unmanufacturable IC features. Conflict graphs 380, 382, and 384, include a plurality of first feature nodes 372, a plurality of second feature nodes 374, and a plurality of third feature nodes 378 which correspond to features 302, 304, and 308 on tile 324. Nodes which are located relative one another at a distance that is less than $\alpha$ in decomposed layout 300 and/or tile 324, are connected by a line/edge 376 in conflict graphs 380, 382, and 384. During processing these disconnected conflict graphs 350, 380, 382, and 384, may be ordered by the number of nodes contained therein. Color flipping may be performed on any and/or all of conflict graphs 350, 380, 382, and 384. Further, local color modification may be performed on any node of conflict graphs 350, 380, 382, and 384.

Figure 9:
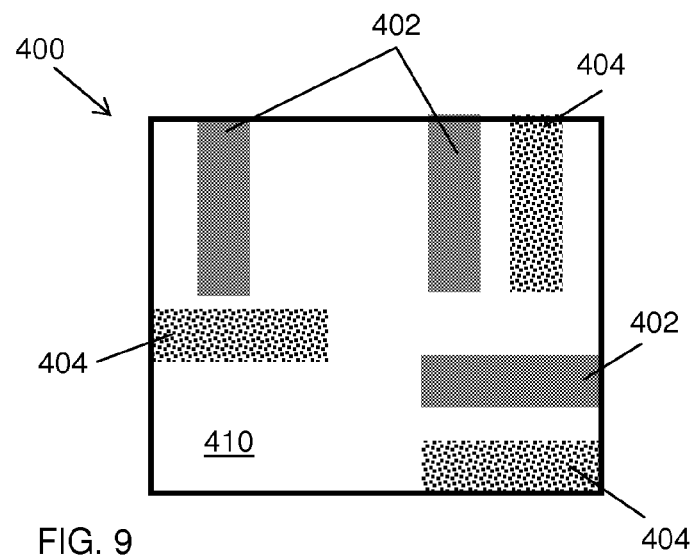
FIGS. 9-10 are demonstrative illustrations of a schematic layout fill process according to various embodiments of the invention.
Figure 10:
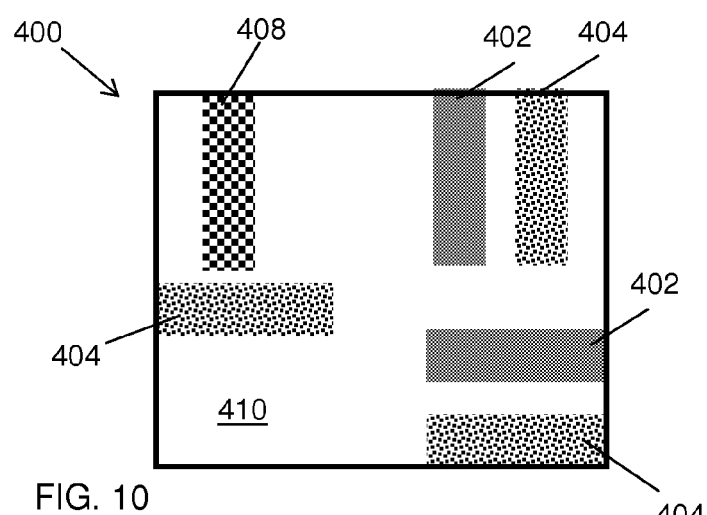
Figure 11:
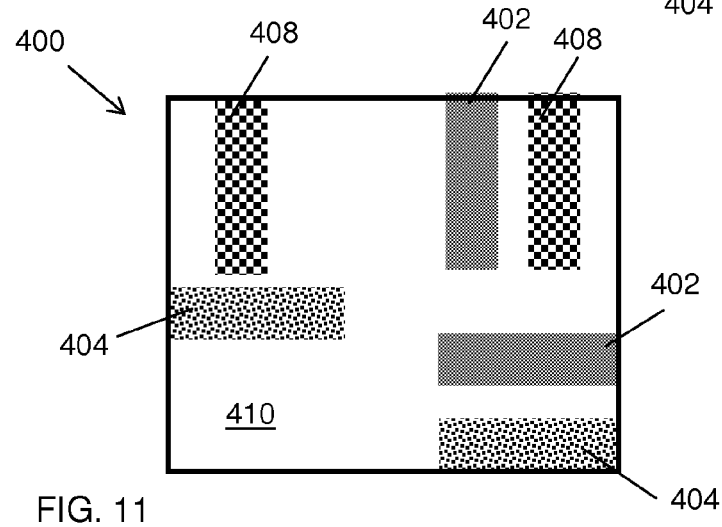
FIG. 11 is a demonstrative illustration of a schematic layout fill process according to various embodiments of the invention.

Turning to FIGS. 9-11, a demonstrative illustration of an example of a schematic color flipping process for balancing color density of a tile 410 in a three exposure decomposed layout is shown according to embodiments. Following tiling of a decomposed layout, the subsequent conflict graphs may be processed to determine/calculate feature and/or color densities for the layout and tiles. The densities for the different colors in tile 410 are computed and stored as $D_1, D_2, \ldots D_n$, for an n-exposure process. These conflict graphs may be stored in a priority queue which is ordered by the number of nodes contained in each conflict graph. In one embodiment, once each conflict graph has been processed, the head conflict graph in the queue may be further analyzed for color-flipping by a color-flipping algorithm. This analysis may include calculating an area of each color in the graph. Then the exposure/color (Ex) with minimum density ($D_x$) may be selected as a minimum and the exposure/color (Ey) with maximum density ($D_y$) may be selected as a maximum. If the area of Ex is greater than the area of Ey in the selected graph, then Ex nodes/features and Ey nodes/features are swapped for the head conflict graph. The density of each color in the tile ($D_1, D_2, \ldots D_n$) is updated after this operation, since it effectively modifies the densities of two exposures. Calculations may then be updated and the process repeated until the tile density approaches/is balanced.

Returning to FIG. 9, a tile 410 of a decomposed layout 400 is shown including a plurality of first features 402 (e.g., features formed by the first exposure) and a plurality of second features 404 (e.g., features formed by the second exposure) according to embodiments. In this embodiment, tile 410 has a density of 0.5 first features 402 and 0.5 second features 404; a third feature 408 (e.g., features formed by the third exposure) is not included in tile 410 and thus has a density of 0. In FIG. 10, one of first features 402 is replaced by a third feature 408 according to embodiments. Replacement of one of first features 402 gives tile 410 a density of 0.33 first feature 402, 0.5 second feature 404, and 0.16 third feature 408. In FIG. 11, one of second features 404 is replaced by a third feature 408 according to embodiments. Replacement of one of second features 404 gives tile 410 a density of 0.33 first feature 402, 0.33 second feature 404, and 0.33 third feature 408, thereby achieving density balance on tile 410.

Figure 12:
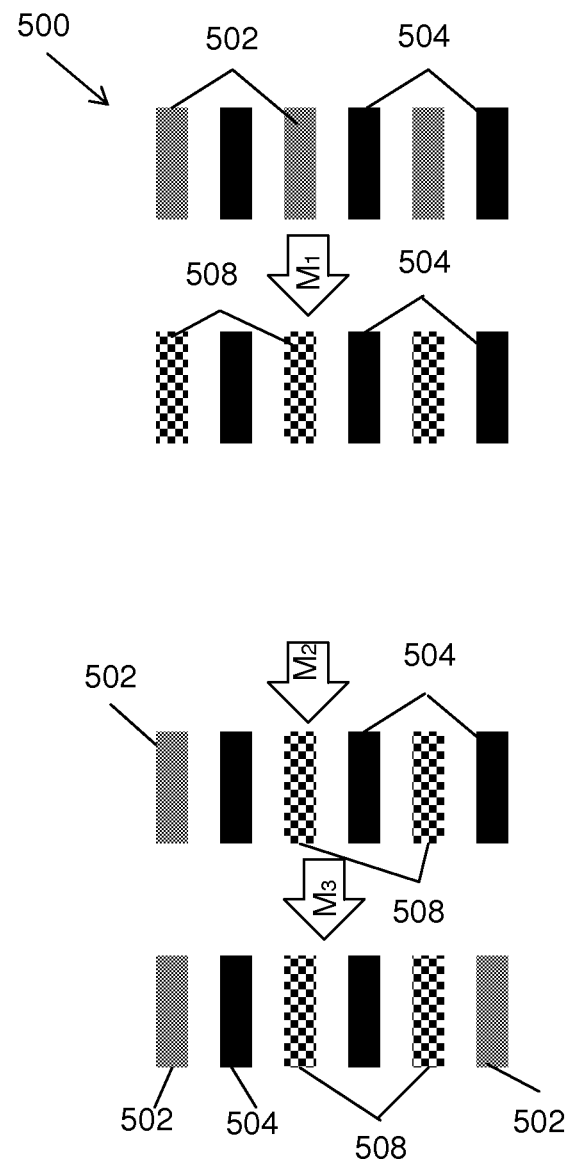
FIG. 12 is a demonstrative illustration of a schematic layout fill process according to various embodiments of the invention.

Turning to FIG. 12, a demonstrative illustration of an example of a schematic density-aware local color modification (LCM) process balancing color density of a tile in a three exposure decomposed layout is shown according to embodiments. LCM may be used where color-flipping alone is not adequate to guarantee balanced densities (e.g., where flipping still results in unbalanced densities). An LCM algorithm may analyze each tile/conflict graph of a given decomposed layout and then individually change/replace nodes/features of the graph/tile with features from a less dense exposure. If there are an odd number of cycles on the conflict graph then LCM stops for the given tile/conflict graph. For each node with exactly one conflict (e.g., graph edge), the color of the node is determined and this is compared with the exposure with minimum density. If the color of the node and that of an adjacent node is different than the exposure with minimum density then the node is switched to the exposure with minimum density and the densities are updated. For each node with exactly two conflicts (e.g., 2 graph edges), the color of the node is determined as the color of the two nodes in conflict therewith. If the colors of the two nodes in conflict are not the same relative one another, then the LCM algorithm moves to analyze the next node. However, if the two conflicting nodes are the same color then the central node is replaced by a node of the minimum exposure density, provided this minimum exposure density color is not the same color as the adjacent nodes. These processes may be continued for each conflict graph until the density of the layout approaches/is balanced.

In FIG. 12, portions of a tile 500 which are part of a three exposure layout is shown including a first set of features 502 and a second set of features 504. The density of tile 500 is then 0.5 first set of features 502, 0.5 second set of features 504 and 0.0 third set of features 508. In process M1, a color flip is performed in which first set of features 502 is flipped for third set of features 508. However, in this instance, the color-flip does not improve the balance, instead only resulting in a density of tile 500 that is 0.0 first set of features 502, 0.5 second set of features 504 and 0.5 third set of features 508. Following process M1, in process M2, LCM is applied to tile 500, replacing a node/feature from third set of features 508 with a node/feature from first set of features 502. This LCM improves but does not balance the tile 500, resulting in a density of 0.16 first set of features 502, 0.5 second set of features 504 and 0.33 third set of features 508. Following process M2, in process M3 LCM is applied again, replacing a node/feature from second set of features 504 with a node/feature from first set of features 502. This LCM balances the tile 500, resulting in a density of 0.33 first set of features 502, 0.33 second set of features 504 and 0.33 third set of features 508.

Figure 13:
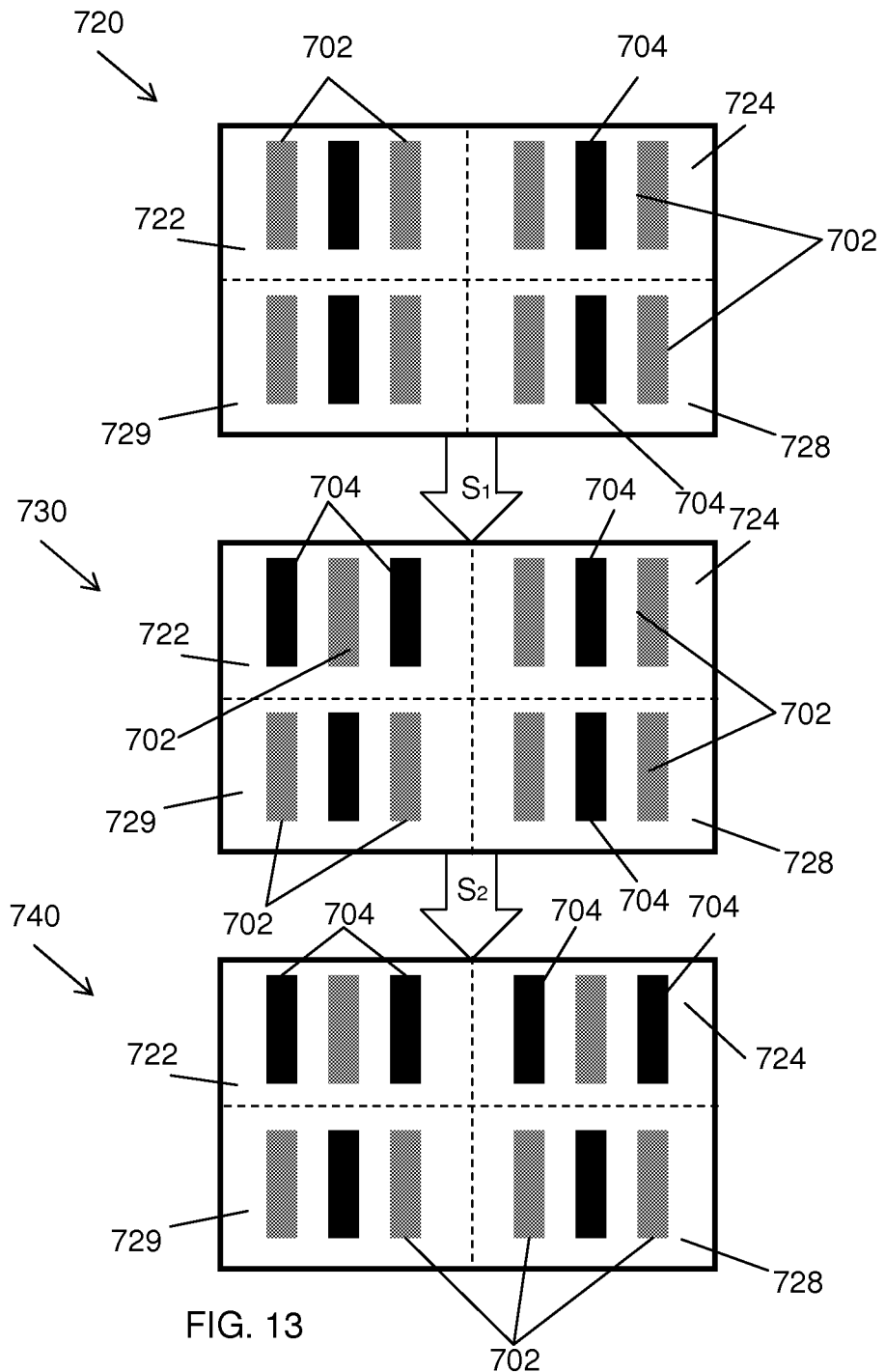
FIG. 13 is a demonstrative illustration of a schematic layout fill process according to various embodiments of the invention.

Turning to FIG. 13, a demonstrative illustration of an example of a schematic density modification process for balancing color density of a tile in a two exposure decomposed layout is shown according to embodiments. In this embodiment, a decomposed layout 720 includes a set of first structures 702 and a set of second structures 704. Decomposed layout 720 is shown undergoing processes described herein to balance color densities thereon. As can be seen, following decomposition, the color densities on decomposed layout 720 are unbalanced (e.g., $2/3$ set of first structures 702 and $1/3$ set of second structures 704). Initially, decomposed layout 720 is divided into a first conflict graph 720, a second conflict graph 724, a third conflict graph 728, and a fourth conflict graph 729 (shown in phantom) in accordance with methods described herein. A color-flipping process is then progressively performed on the conflict graphs in accordance with methods described herein to balance the densities of decomposed layout 720. As all tiles have an equal number of nodes, processing begins with tile 722, it is determined that set of first structures 702 is the exposure with maximum density in decomposed layout 720 and second structure 704 has a minimum density in decomposed layout 720. It is further determined that in tile 722 set of first structures 702 have a greater area than set of second structures 704. As such, through step S1, in tile 722 set of first structures 702 are swapped for a set of second structures 704, and second structure 704 is swapped for a first structure 702, generating a decomposed layout 730 with a configuration as shown.

Decomposed layout 730 is then processed to determine if color densities are balanced, as can be seen, the color densities have progressed toward a balanced state but are not balanced (e.g., $7/12$ first set of structures and $5/12$ second set of structures). Processing then proceeds with tile 724, it is determined that set of first structures 702 is still the exposure with maximum density in decomposed layout 730 and that second structure 704 still has a minimum density in decomposed layout 730. It is further determined that in tile 724 set of first structures 702 have a greater area than set of second structures 704. As such, through step S2, in tile 724 set of first structures 702 are swapped for a set of second structures 704, and second structure 704 is swapped for a first structure 702, generating a decomposed layout 740 with a configuration as shown. Decomposed layout 740 is processed and as can be seen it is determined that the color densities have been balanced so the color-flipping process is stopped.

Figure 14:
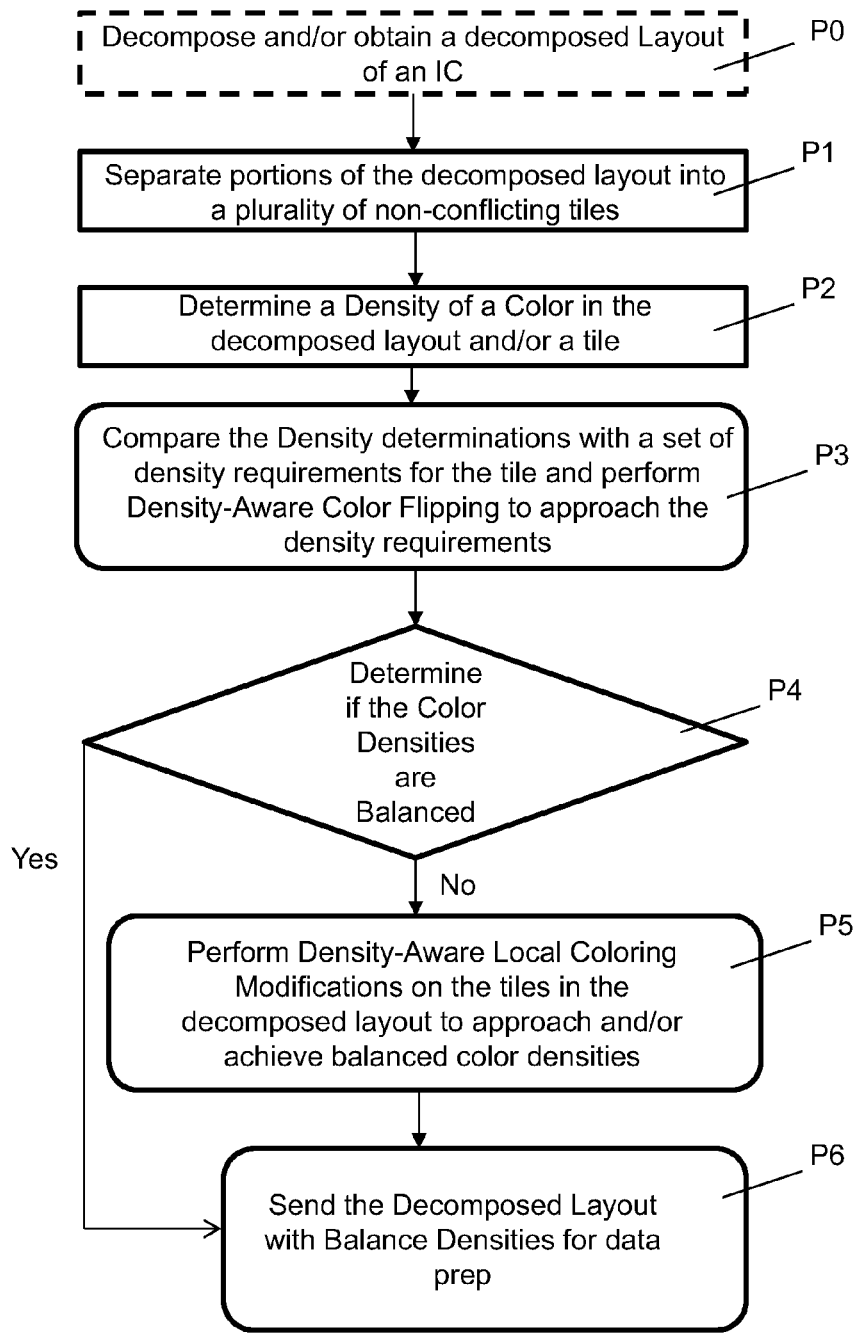
FIG. 14 is a demonstrative illustration of a flow diagram illustrating a process according to various embodiments of the invention.

FIG. 14 is a demonstrative illustration of a flow diagram illustrating methods according to various embodiments of the invention. As shown, the methods can include optional (or additional) processes (shown in phantom), which can be performed according to some embodiments. Turning to optional process P0, the method can include decomposing and/or obtaining a decomposed layout for an IC. This can include compiling an IC layout, receiving a decomposed layout from a source, etc. Following optional process P0, process P1 may include separating portions of the decomposed layout into non-conflicting tiles, as described herein. Following process P1, process P2 may include determining a density of a color in the decomposed layout and/or a tile of the decomposed layout. In one embodiment, a density of each color in each tile of the decomposed layout may be determined. Following process P2, process P3 may include processing and/or comparing the density requirements of the IC, tile, and/or layout with the existing color densities. In one embodiment, density aware color flipping may be performed as described herein to approach and/or achieve the density requirements. Following process P3, process P4 may include determining if the color densities are balanced on the IC, the layout, and/or the tile. If it is determined that the color densities are balanced then in process P6 the decomposed layout with balanced densities is sent to data prep (e.g., the process of converting a given decomposed layout into its respective multiple masks for manufacturing). Alternatively, if it is determined that the color densities are not balanced, then following process P4, in process P5, density aware local coloring modifications may be performed as described herein. The tiles and/or decomposed layout may be subjected to density aware local coloring modifications until the layout approaches and/or is balanced. Once balanced, at process P6 the decomposed layout with balanced densities is sent to data prep.

In one particular example, a method according to various embodiments of the invention can include using a heuristic based algorithm (e.g., a layout tiling algorithm) for dividing a decomposed IC layout into a set of non-conflicting tiles. For the examples shown and described herein, the following algorithm can be used to create a set of tiles which represent the decomposed layout:

1. Begin processing from the origin of the decomposed layout;

2. Create tile of minimum size at the current location proximate the origin, allowable size of tile (e.g., minimum size) may be effected any number of factors including, the parallel processing power of the system performing the analysis, the long range effects of the tile dimensions (e.g., etch effects);

3. While conflict exists across tile boundaries t<α (min. required fill density);

4. Expand tile boundary which contains conflict, expansion may be arbitrary and/or incremental (e.g., in multiples of metal pitch);

5. Once all conflicts eliminated, accept tile; and

6. Move to next location and go back to step 2 until entire decomposed layout has been tiled.

In another particular example, a method according to various embodiments of the invention can include using a heuristic based algorithm (e.g., a color flipping algorithm) for performing density-aware color-flipping in a decomposed IC layout. For the examples shown and described herein, the following algorithm can be used to perform color flipping on decomposed layouts:

1. Read conflict graphs for a given tile;

2. Calculate the densities of different colors in the tile $d_{E1}$, $d_{E2}$, $d_E$;

3. Store disconnected conflict graphs in a priority queue ordered by the number of nodes in each conflict graph;

4. If the queue is not empty select the head conflict graph in the queue;

5. Calculate area of each color $A_{E1}$, $A_{E2}$, $A_{E3}$ in the head conflict graph;
6. Select the exposure with minimum density Ex;
7. Select the exposure with maximum density Ey;
8. If $A_{Ex} > A_{Ey}$ then swap Ex and Ey on the conflict graph;
9. Update $d_{Ex} = d_{Ex} + (A_{Ey} - A_{Ex})/A_{tot}$ and $d_{Ey} = d_{Ey} - (A_{Ey} - A_{Ex})/A_{tot}$; and
10. If $(d_{E1}, d_{E2}, d_{E3}) > d_{min}$ then stop, else return to step 4.

In another particular example, a method according to various embodiments of the invention can include using a heuristic based algorithm (e.g., a local color modification algorithm) for local color modification in a tile and/or decomposed IC layout. For the examples shown and described herein, the following algorithm can be used to locally modify colors in a given tile:

1. Select conflict graph to analyze;
2. If conflict graph includes odd cycles, stop;
3. If even cycles then analyze each node and determine the number of conflicts for each node;
4. For each node with exactly one conflict (1 graph edge):
   i. determine a color of the node and swap with the color exposure with minimum density, provided this is not the same as the color of the adjacent node;
   ii. Update the densities of the decomposed layout;
5. For each node with exactly two conflicts (2 graph edges):
   i. determine the color of the node ($E_{cur}$);
   ii. determine the color of the first adjacent node $E_{left}$;
   iii. determine the color of the second adjacent node ($E_{right}$);
   iv. if $E_{left} \ne E_{right}$ then proceed to next node, else swap $E_{cur}$ node with exposure node with minimum densities ($E_{min}$), as long as $E_{min} \ne E_{right}$; and
6. Update densities of the decomposed layout.

It is understood that the algorithms described herein are exemplary embodiments and may be performed individually or combined, in any order and/or sequence.

Figure 15:
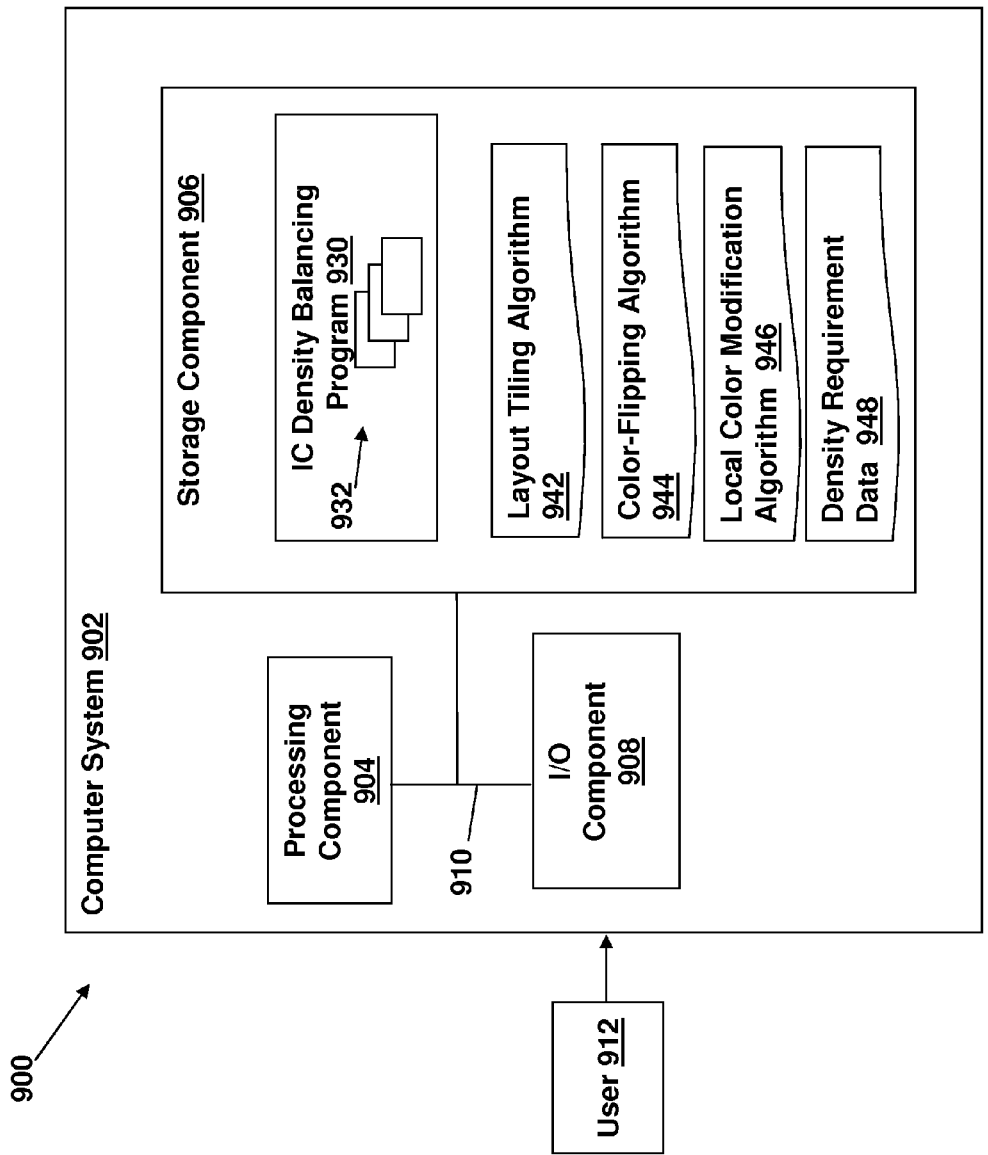
FIG. 15 is a demonstrative illustration of an environment including a system according to various embodiments of the invention.

FIG. 15 is a demonstrative illustration of an environment 900 for balancing densities in an integrated circuit layout according to an embodiment. To this extent, the environment 900 includes a computer system 902 that can perform a process described herein in order to balance color densities for a decomposed IC layout in an integrated circuit design. In particular, the computer system 902 is shown as including a post decomposition IC layout density balancing program 930, which makes computer system 902 operable to handle balancing integrated circuit layout density by performing any/all of the processes described herein and implementing any/all of the embodiments described herein.

The computer system 902 is shown including a processing component 904 (e.g., one or more processors), a storage component 906 (e.g., a storage hierarchy), an input/output (I/O) component 908 (e.g., one or more I/O interfaces and/or devices), and a communications pathway 910. In general, the processing component 904 executes program code, such as the post decomposition IC layout density balancing program 930, which is at least partially fixed in the storage component 906. While executing program code, the processing component 904 can process data, which can result in reading and/or writing transformed data from/to the storage component 906 and/or the I/O component 908 for further processing. The pathway 910 provides a communications link between each of the components in the computer system 902. The I/O component 908 can comprise one or more human I/O devices, which enable a human user 912 to interact with the computer system 902 and/or one or more communications devices to enable a system user 912 to communicate with the computer system 902 using any type of communications link. To this extent, the post decomposition IC layout density balancing program 930 can manage a set of interfaces (e.g., graphical user interface(s), application program interface, etc.) that enable human and/or system users 912 to interact with the post decomposition IC layout density balancing program 930. Further, the post decomposition IC layout density balancing program 930 can manage (e.g., store, retrieve, create, manipulate, organize, present, etc.) algorithms/data, such as layout tiling algorithm 942, color-flipping algorithm 944, local color modification algorithm 946 and/or density requirement data 948 etc., using any solution.

In any event, the computer system 902 can comprise one or more general purpose computing articles of manufacture (e.g., computing devices) capable of executing program code, such as the post decomposition IC layout density balancing program 930, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the post decomposition IC layout density balancing program 930 can be embodied as any combination of system software and/or application software.

Further, the post decomposition IC layout density balancing program 930 can be implemented using a set of modules 932. In this case, a module 932 can enable the computer system 902 to perform a set of tasks used by the post decomposition IC layout density balancing program 930, and can be separately developed and/or implemented apart from other portions of the post decomposition IC layout density balancing program 930. As used herein, the term "component" means any configuration of hardware, with or without software, which implements the functionality described in conjunction therewith using any solution, while the term "module" means program code that enables the computer system 902 to implement the functionality described in conjunction therewith using any solution. When fixed in a storage component 906 of a computer system 902 that includes a processing component 904, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 902.

When the computer system 902 comprises multiple computing devices, each computing device may have only a portion of post decomposition IC layout density balancing program 930 fixed thereon (e.g., one or more modules 932). However, it is understood that the computer system 902 and post decomposition IC layout density balancing program 930 are only representative of various possible equivalent computer systems that may perform a process described herein. To this extent, in other embodiments, the functionality provided by the computer system 902 and post decomposition IC layout density balancing program 930 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 902 includes multiple computing devices, the computing devices can communicate over any type of communications link. Further, while performing a process described herein, the computer system 902 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 902 can obtain or provide algorithms and/or data, such as layout tiling algorithm 942, color-flipping algorithm 944, local color modification algorithm 946 and/or density requirement data 948 etc. using any solution. For example, the computer system 902 can generate and/or be used to generate tiles, swap colors, modify features and/or colors, etc., from one or more decomposed layouts, from another system, and/or send layout tiling algorithm 942, color-flipping algorithm 944, local color modification algorithm 946 and/or density requirement data 948 to another system, etc.

While shown and described herein as a method and system for balancing IC layout density, it is understood that aspects of the invention further provide various alternative embodiments. For example, in one embodiment, the invention provides a computer program fixed in at least one computer-readable medium, which when executed, enables a computer system to balance IC layout density. To this extent, the computer-readable medium includes program code, such as the post decomposition IC layout density balancing program 930 (FIG. 15), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the post decomposition IC layout density balancing program 930 (FIG. 15), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for correcting a mask deviation. In this case, a computer system, such as the computer system 902 (FIG. 15), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A method of modifying a decomposed integrated circuit (IC) layout for a multiple patterning process, the method comprising:
    providing the decomposed IC layout, the decomposed IC layout including a set of colors;
    separating the decomposed IC layout into a set of tiles;
    determining a density of each color in at least one tile in the set of tiles, wherein each color includes a plurality of features formed by a related exposure;
    determining a first color with a minimum density in the at least one tile of the set of tiles and a second color with a maximum density in the at least one tile, the first color including a first set of first features and the second color including a first set of second features; and
    replacing the first set of second features on the at least one tile with a second set of first features, and the first set of first features on the at least one tile with a second set of second features.

2. The method of claim 1, wherein the separating the decomposed IC layout into a set of tiles includes generating a set of conflict graphs for each tile in the set of tiles, the set of conflict graphs including nodes representative of groupings of features within each tile.

3. The method of claim 2, further comprising performing a local color modification on the at least one tile following the replacing the first set of second features and the first set of first features, wherein the local color modification includes replacing a single node of a first color on the decomposed IC layout with a node of a second color.

4. The method of claim 2, wherein the first set of second features and first set of first features are disposed within a first conflict graph in the at least one tile, the at least one tile including a plurality of conflict graphs.

5. The method of claim 1, wherein the separating the decomposed IC layout into a set of tiles includes:
selecting a set of tile boundaries on the decomposed IC layout, the set of tile boundaries isolating a portion of the decomposed IC layout;
determining if at least one conflict exists across at least one of the tile boundaries; and
relocating a tile boundary in conflict until the boundaries of the tile are conflict free.

6. The method of claim 5, wherein the relocating includes moving a location of the tile boundary in conflict by a multiple of pitch for a metal in the IC.

7. The method of claim 1, wherein the set of tiles are non-conflicting and each of the tiles in the set of tiles are processed in parallel.

8. A system comprising:
at least one computing device configured to modify a decomposed integrated circuit (IC) layout for a multiple patterning process by performing actions including:
providing the decomposed IC layout, the decomposed IC layout including a set of colors;
separating the decomposed IC layout into a set of tiles;
determining a density of each color in at least one tile in the set of tiles,
wherein each color includes a plurality of features formed by a related exposure;
determining a first color with a minimum density in the at least one tile of the set of tiles and a second color with a maximum density in the at least one tile, the first color including a first set of first features and the second color including a first set of second features; and
replacing a single feature of the second color on the decomposed layout with a single feature of the first color.

9. The system of claim 8, wherein the separating the decomposed IC layout into a set of tiles includes generating a set of conflict graphs for each tile in the set of tiles, the set of conflict graphs including nodes representative of groupings of features within each tile.

10. The system of claim 9, further comprising performing a color flip on at least one tile following the determining a first color with a minimum density,
wherein the color-flip includes replacing the first set of second features on the at least one tile with a second set of first features, and the first set of first features on the at least one tile with a second set of second features.

11. The system of claim 8, wherein the first set of second features and first set of first features are disposed within a first conflict graph in the at least one tile, the at least one tile including a plurality of conflict graphs.

12. The system of claim 8, wherein the separating the decomposed IC layout into a set of tiles includes:
selecting a set of tile boundaries on the decomposed IC layout, the set of tile boundaries isolating a portion of the decomposed IC layout;
determining if at least one conflict exists across at least one of the tile boundaries; and
relocating a tile boundary in conflict until the boundaries of the tile are conflict free.

13. The system of claim 12, wherein the relocating includes moving a location of the tile boundary in conflict by a multiple of pitch for a metal in the IC.

14. The system of claim 8, wherein the set of tiles are non-conflicting and each of the tiles in the set of tiles are processed in parallel.

15. A computer program product having program code stored on a non-transitory computer-readable medium, which when executed by at least one computing device, causes the at least one computing device to perform actions comprising:
providing a decomposed IC layout, the decomposed IC layout including a set of colors;
separating the decomposed IC layout into a set of tiles;
determining a density of each color in at least one tile in the set of tiles,
wherein each color includes a plurality of features formed by a related exposure;
determining a first color with a minimum density in the at least one tile of the set of tiles and a second color with a maximum density in the at least one tile, the first color including a first set of first features and the second color including a first set of second features; and
replacing the first set of second features on the at least one tile with a second set of first features, and the first set of first features on the at least one tile with a second set of second features.

16. The computer program product of claim 15, wherein the at least one computing device further performs a local color modification on the at least one tile following the replacing the first set of second features and the first set of first features,
wherein the local color modification includes replacing a single node of a first color on the decomposed layout with a node of a second color.

17. The computer program product of claim 16, wherein the separating the decomposed IC layout into a set of tiles includes generating a set of conflict graphs for each tile in the set of tiles, the set of conflict graphs including nodes representative of groupings of features within each tile.

18. The computer program product of claim 15, wherein the first set of second features and first set of first features are disposed within a first conflict graph in the at least one tile, the at least one tile including a plurality of conflict graphs.

19. The computer program product of claim 15, wherein the separating the decomposed IC layout into a set of tiles includes:
selecting a set of tile boundaries on the decomposed IC layout, the set of tile boundaries isolating a portion of the decomposed IC layout;
determining if at least one conflict exists across at least one of the tile boundaries; and
relocating a tile boundary in conflict until the boundaries of the tile are conflict free.

20. The computer program product of claim 15, wherein the set of tiles are non-conflicting and each of the tiles in the set of tiles are processed in parallel.

* * * * *